US006646502B1

(12) United States Patent
Kruiskamp (10) Patent No.: US 6,646,502 B1
(45) Date of Patent: Nov. 11, 2003

(54) DIGITAL-INPUT CLASS-D AMPLIFIER (75) Inventor: Marinus Wilhelmus Kruiskamp, 's-Hertogenbosch (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/212,904

(22) Filed: Aug. 6, 2002

(51) Int. Cl.[7] .................................................. H03F 3/38
(52) U.S. Cl. ...................................................... 330/10
(58) Field of Search ............................ 330/10; 341/120, 341/118, 143; 375/216, 242, 268, 298

(56) References Cited

U.S. PATENT DOCUMENTS

| | | | | |
|---|---|---|---|---|
| 6,118,336 A | * | 9/2000 | Pullen et al. | 330/10 |
| 6,127,885 A | * | 10/2000 | Colangelo | 330/10 |
| 6,466,087 B2 | * | 10/2002 | Ruha | 330/10 |
| 6,489,841 B2 | * | 12/2002 | Takagishi | 330/10 |
| 6,563,377 B2 | * | 5/2003 | Butler | 330/10 |

OTHER PUBLICATIONS

Stewart, R.W. and Pfann, E., Oversampling and sigma–delta strategies for data conversion, Electronic & Communication Engineering Journal, Feb. 1998, pp. 37–47.

Van Der Zee, Ronan A.R. and Van Tuijl, Ed (A.J.M.), A Power–Efficient Audio Amplifier Combining Switching and Linear Techniques, IEEE Journal of Solid–State Circuits, Vol;. 34, No. 7, Jul. 1999, pp. 985–991.

* cited by examiner

Primary Examiner—My-Trang Nu Ton
(74) Attorney, Agent, or Firm—Vedder, Price, Kaufman & Kammholz, P.C.

(57) ABSTRACT

A class-D amplifier having a high power supply rejection ratio (PSRR) while accepting a digital input signal and not requiring an output signal filter, thereby being ideally suited for integration as part of a system on a chip. The input signal is converted by a first delta-sigma modulator to provide a first multivalue digital signal representing the desired output. This first multivalue digital signal is combined with a second multivalue digital signal provided by a second delta-sigma modulator to provide a third multivalue digital signal. This third multivalue digital signal is converted to binary digital output signals for differentially driving a load. These binary digital output signals are also fed back and combined with the first multivalue digital signal to provide the feedback signal for the second delta-sigma modulator.

20 Claims, 7 Drawing Sheets

DIGITAL-INPUT CLASS-D AMPLIFIER

BACKGROUND OF THE INVENTION

1. Field of the Invention

The present invention applies to class-D amplifiers, and in particular, class-D audio amplifiers operating in a purely digital signal environment and, therefore, suitable for integration as part of a system on a chip.

2. Description of the Related Art

Figure 1:
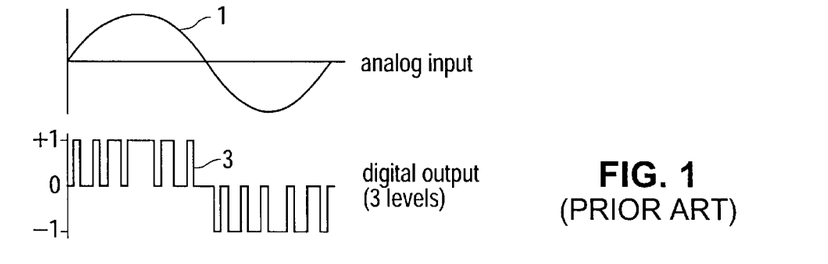
FIG. 1 is a signal timing diagram depicting the timing relationship between an analog input signal and a three-level digital output signal of a conventional class-D amplifier circuit.

Referring to FIG. 1, as is well known in the art, class-D amplifiers receive an analog input signal 1 (e.g., depicted as a pure sine wave) and generates a digital output signal 3 (e.g., a bipolar, or three-level, pulse width modulated signal) having a low frequency component that is proportional to the input signal 1. As is well known, one advantage of a class-D amplifier over a linear amplifier (e.g., class-AB) is greater efficiency, often approaching 100%. One common application for a class-D amplifier is as a driver for a loudspeaker. Such high efficiency makes class-D audio amplifiers quite suitable for integration as part of a system on a chip. One example of such a system on a chip would be a baseband processor for cellular or cordless telephones.

Figure 2:
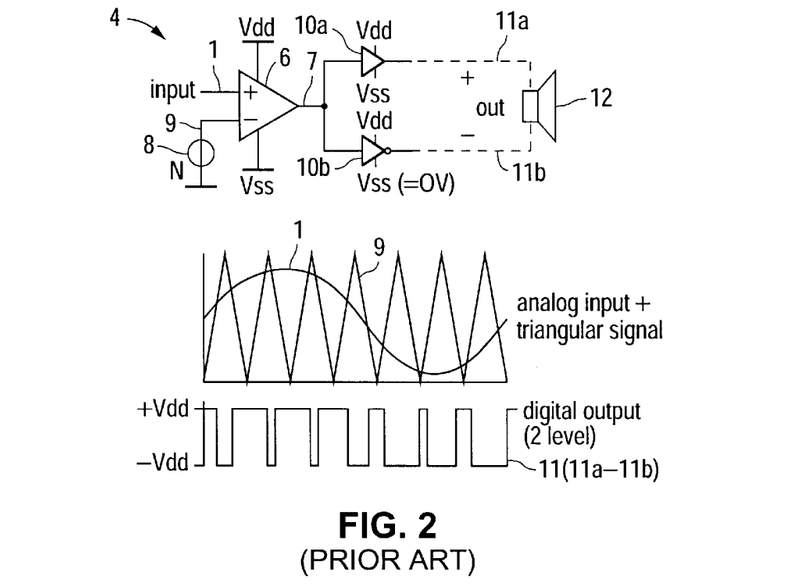
FIG. 2 is a schematic diagram and signal timing diagram for a conventional class-D amplifier circuit.

Referring to FIG. 2, a class-D amplifier 4 has often been implemented using a signal comparison circuit 6, a reference signal source 8, a non-inverting output driver 10a and an inverting output driver 10b interconnected substantially as shown. The analog input signal 1 is compared against a triangular reference signal 9 produced by the reference signal source 8. The resultant comparison signal 7 is buffered by the output driver amplifiers 10a, 10b to produce the drive signals 11a, 11b for the loudspeaker 12. Usually, a low pass filter (not shown) is also placed between the output signal 11 and loudspeaker 12.

This amplifier 4 can be implemented using only a few simple analog circuit blocks. However, such a circuit 4 requires a stable power supply voltage VDD for the output buffer amplifiers 10a, 10b. Accordingly, since there is no feedback from the actual digital output signals 11a, 11b any variations in the power supply voltage VDD will be reflected in the output signals 11a, 11b. Hence, such a circuit 4 has a poor power supply rejection ratio (PSRR). Further, since the output signal switching frequency is not very high, the external low pass filter (not shown) is usually necessary.

Figure 3:
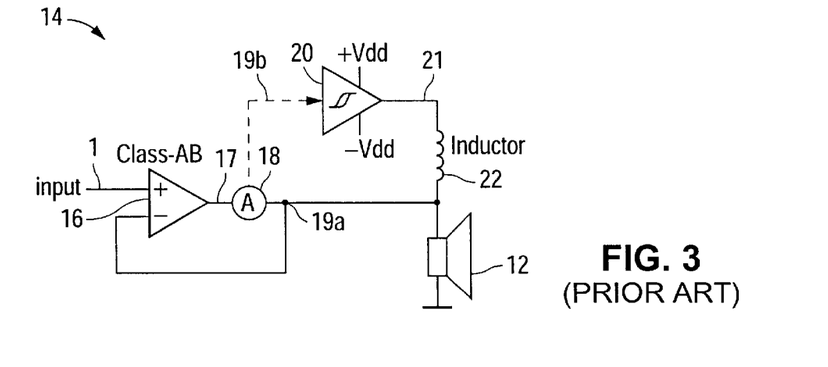
FIG. 3 is a schematic diagram of another conventional class-D amplifier circuit.

Referring to FIG. 3, a higher PSRR can be achieved with a class-D amplifier circuit 14 in which a linear class-AB amplifier 16 is used. Such a circuit 14 includes the class-AB amplifier 16, a current sensing circuit 18 (e.g., an electronic equivalent of an ammeter) and a digital output amplifier 20, interconnected substantially as shown. The analog input signal 1 is buffered by the differential class-AB amplifier circuit 16 operating as a voltage follower circuit. The amplified input signal 17 passes through the current sensing circuitry 18, the main output signal 19a of which provides the feedback for the class-AB amplifier 16 and some amount of drive for the loudspeaker 12.

The current sensing output 19b of the current sensing circuitry 18 drives the digital output amplifier 20. It is this output 21 of the digital output buffer amplifier 20 that provides the majority of the drive current for the loudspeaker 12. Hence, the output 19a from the class-AB amplifier circuit 16 need only provide that relatively small amount of current necessary for maintaining the signal to the loudspeaker 12 at the desired level. A low pass filter, such as an inductor 22, is necessary to provide isolation between the output terminals of the class-AB 16 and output 20 amplifiers.

While this circuit 14 provides an improved PSRR, it nonetheless continues to require an external low pass filter 22, as well as an analog input signal 1. Accordingly, implementation of this type of circuitry 14 in fully integrated form (e.g., for use as part of a system on a chip) remains problematic.

Figure 4:
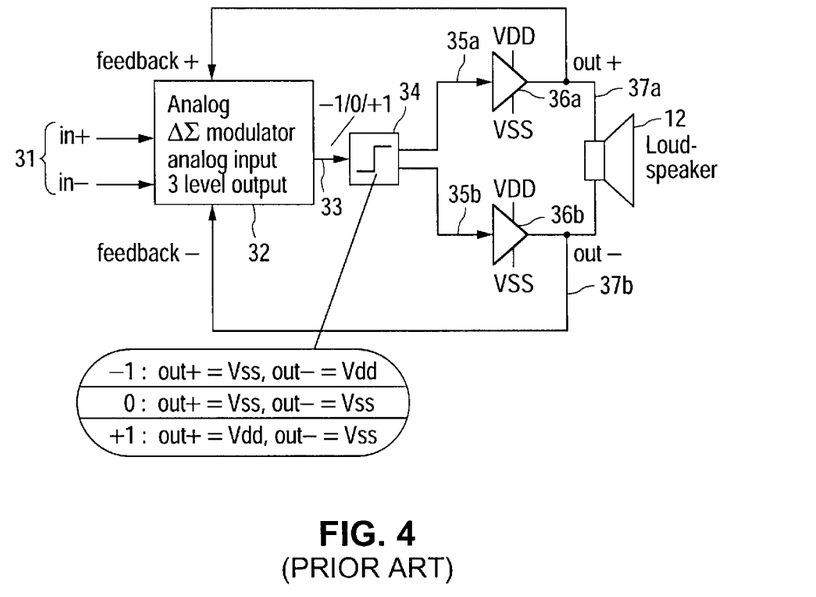
FIG. 4 is a schematic diagram of still another conventional class D amplifier circuit.

Referring to FIG. 4, another conventional class-D amplifier circuit 30 uses a delta-sigma modulator (analog) 32, a signal slicer 34 and output buffer amplifiers 36a, 36b, interconnected substantially as shown, to drive the loudspeaker 12. A differential analog input signal 31 is processed by the delta-sigma modulator 32 to produce a three-level output signal 33 (having values of −1, 0 or +1). This signal 33 is processed by the signal slicer 34 to produce the drive signals 35a, 35b for the output buffer amplifiers 36a, 36b. These output signals 35a, 35b are binary in that they have one of two states, depending upon the value of the slicer input signal 33. For example, as indicated in FIG. 4, if the slicer input signal 33 has a value of +1, the Out+ signal 37a equals the positive power supply voltage VDD, and the Out− signal 37b equals the potential of the negative power supply voltage terminal VSS. The output drive signals 37a, 37b also serve as the feedback signals for the delta-sigma modulator 32 (in accordance with well known delta-sigma modulator circuit principles).

This type of circuit 30 has a good PSRR since the output buffer amplifiers 36a, 36b form part of the feedback loops for the delta-sigma modulator 32. Accordingly, variations in the power supply voltage VDD or other voltage drops in the output amplifiers 36a, 36b are compensated by virtue of the feedback loops. Additionally, no external low pass filtering is required when a high oversampling ratio (OSR) is used in combination with the three-level output signal 33 generated by the delta-sigma modulator. However, the delta-sigma modulator 32 must still function as an analog circuit in order to compensate for analog variations in the power supply voltage VDD and other voltage drops in the output amplifiers 36a, 36b.

Accordingly, it would be desirable to have a class-D amplifier circuit with a very high PSRR, no requirement for external filtering, and the capability for operating with a digital input signal.

SUMMARY OF THE INVENTION

In accordance with the presently claimed invention, a class-D amplifier is provided with a high power supply rejection ratio (PSRR) while accepting a digital input signal and not requiring an output signal filter, thereby being ideally suited for integration as part of a system on a chip. The input signal is converted by a first delta-sigma modulator to provide a first multivalue digital signal representing the desired output. This first multivalue digital signal is combined with a second multivalue digital signal provided by a second delta-sigma modulator to provide a third multivalue digital signal. This third multivalue digital signal is converted to binary digital output signals for differentially driving a load. These binary digital output signals are also fed back and combined with the first multivalue digital signal to provide the feedback signal for the second delta-sigma modulator.

In accordance with one embodiment of the presently claimed invention, a class-D amplifier includes delta-sigma modulation circuitry, signal combining circuitry and signal conversion circuitry. The delta-sigma modulation circuitry receives and converts a digital input signal to a first multivalue digital signal corresponding to the digital input signal, and receives a feedback signal and in response thereto receives and converts an analog input signal to a second multivalue digital signal corresponding to the feedback signal. First signal combining circuitry, coupled to the delta-sigma modulation circuitry, receives and combines the first and second multivalue digital signals and in response thereto provides a third multivalue digital signal corresponding to a sum of the first and second multivalue digital signals. The signal conversion circuitry, coupled to the first signal combining circuitry, receives and converts the third multivalue digital signal to first and second binary digital signals with first and second binary signal values that vary in relation to the third multivalue digital signal. Second signal combining circuitry, coupled to the delta-sigma modulation circuitry and the signal conversion circuitry, receives and combines the first multivalue digital signal and the first and second binary digital signals and in response thereto provides the feedback signal.

In accordance with another embodiment of the presently claimed invention, a class-D amplifier includes modulator means, combiner means and converter means. The modulator means is for receiving and converting a digital input signal to a first multivalue digital signal corresponding to the digital input signal, and receiving a feedback signal and in response thereto receiving and converting an analog input signal to a second multivalue digital signal corresponding to the feedback signal. First combiner means is for combining the first and second multivalue digital signals and providing a third multivalue digital signal corresponding to a sum of the first and second multivalue digital signals. The converter means is for converting the third multivalue digital signal to first and second binary digital signals with first and second binary signal values that vary in relation to the third multivalue digital signal. Second combiner means is for combining the first multivalue digital signal and the first and second binary digital signals and providing the feedback signal.

In accordance with still another embodiment of the presently claimed invention, a method for class-D signal amplification includes:

performing delta-sigma modulation of a digital input signal to generate a first multivalue digital signal corresponding to the digital input signal;

receiving a feedback signal and in response thereto performing delta-sigma modulation of an analog input signal to generate a second multivalue digital signal corresponding to the feedback signal;

combining the first and second multivalue digital signals to generate a third multivalue digital signal corresponding to a sum of the first and second multivalue digital signals;

converting the third multivalue digital signal to first and second binary digital signals with first and second binary signal values that vary in relation to the third multivalue digital signal; and combining the first multivalue digital signal and the first and second binary digital signals to generate the feedback signal.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 5:
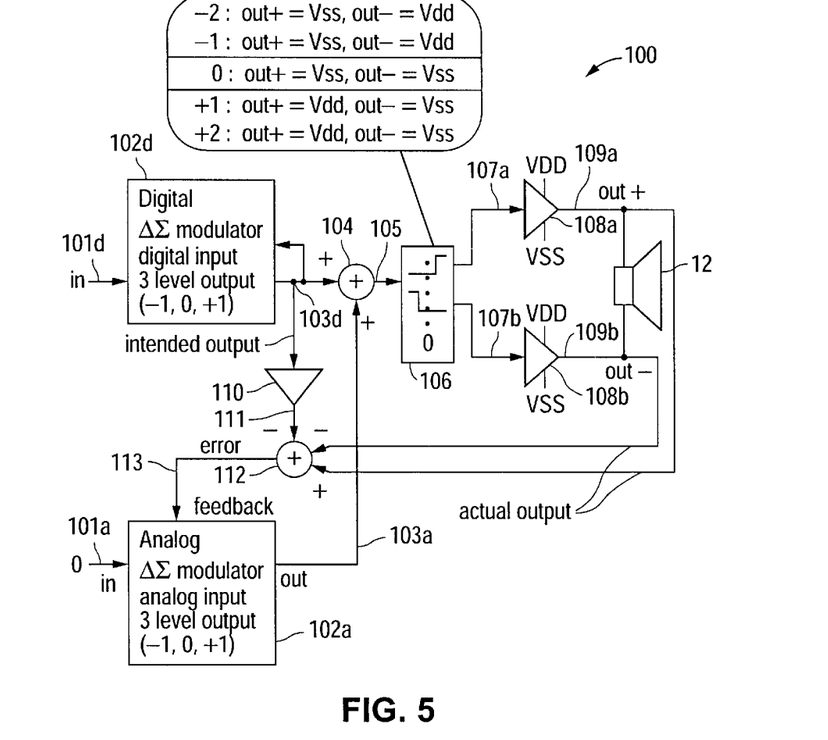
FIG. 5 is a schematic diagram of class-D amplifier circuit in accordance with one embodiment of the presently claimed invention.

Referring to FIG. 5, a digital input class-D amplifier circuit 100 in accordance with one embodiment of the presently claimed invention includes delta-sigma modulator circuitry 102, (e.g., in the form of a digital delta-sigma modulator 102d and an analog delta-sigma modulator 102a), signal combining circuitry 104, signal slicer circuitry 106, output amplifiers 108a, 108b, a buffer amplifier 110 and another signal combiner circuit 112, all interconnected substantially as shown (e.g., to drive a loudspeaker 12). In the following discussion, various digital signals, other then the binary signals produced by the output buffer amplifiers 109a, 109b, are described as being multilevel, e.g., three-level or five-level. However, it will be understood that such signals may alternatively be multivalued digital signals, (e.g., binary digital signals composed of multiple bits representing multiple-valued digital signals).

Figure 5A:
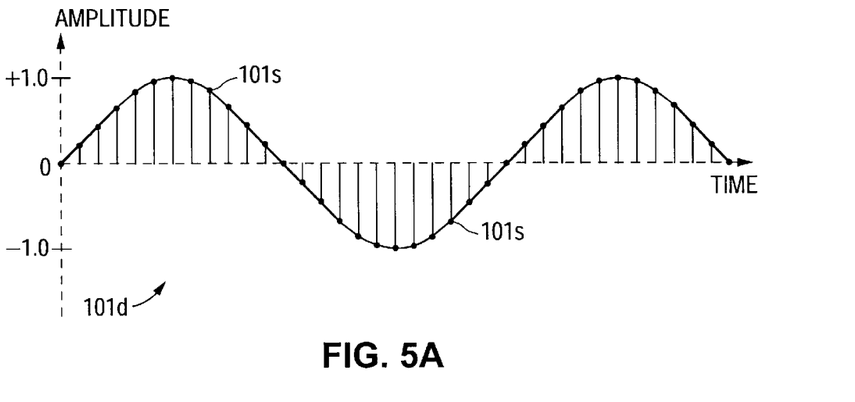
FIG. 5A is a signal diagram depicting the digitized nature of the input signal for the circuit of FIG. 5.

Referring to FIGS. 5 and 5A together, the input delta-sigma modulator 102d receives a digitized input signal 101d representing an analog signal that has been sampled to produce multiple digitized signal samples 101s in accordance with well known sampling techniques. The delta-sigma modulator 102d produces an oversampled three-level output signal 103d as the "intended output" for the circuitry 100. Meanwhile, the other delta-sigma modulator 102a, using a reference analog input signal 101a (e.g., at zero potential) similarly produces an oversampled three-level signal 103a as a correction signal based upon its feedback signal 113 (discussed in more detail below). This correction signal 103a is combined (e.g., summed) with the oversampled input signal 103d (which is also used as the feedback signal for the first delta-sigma modulator 102d).

The resultant combined signal 105 from the signal combining circuitry 104 is processed by the signal slicer 106 to convert the potentially five different levels of the resultant signal 105 to two binary digital signals 107a, 107b. As indicated in FIG. 5, each of the signals from the delta-sigma modulators 102d, 102a has three possible levels, or values: −1, 0 and +1. Accordingly, a combining, or summing, of these signals 103d, 103a produces a signal 105 with as many as five values: −2, −1, 0, +1 and +2. The signal slicer circuitry 106 converts this signal 105 into the binary digital signals 107a, 107b for buffering by the output amplifiers, 108a, 108b. For example, if the delta-sigma modulator signals 103d, 103a are such that their summation produces a signal 105 having a value of +1, the first binary digital signal Out+ 107a /109a will be at the positive power supply potential VDD, while the second binary digital signal Out− 107b /109b will be at the negative power supply voltage potential VSS.

The buffered output signals 109a, 109b that drive the load 12 represent the "actual output" and are fed back to the other signal combiner 112. Within this signal combining circuitry 112, a signed summation is performed in which the buffered intended output signal 111 (buffered by the buffer amplifier 110) and the second binary digital output signal 109b are subtracted from the first binary digital output signal 109a. The resultant signal 113 represents the error between the actual output signal 109 and the intended output signal 103d. It is this error signal 113 that serves as the feedback signal for the second delta-sigma modulator 102a.

Figure 6:
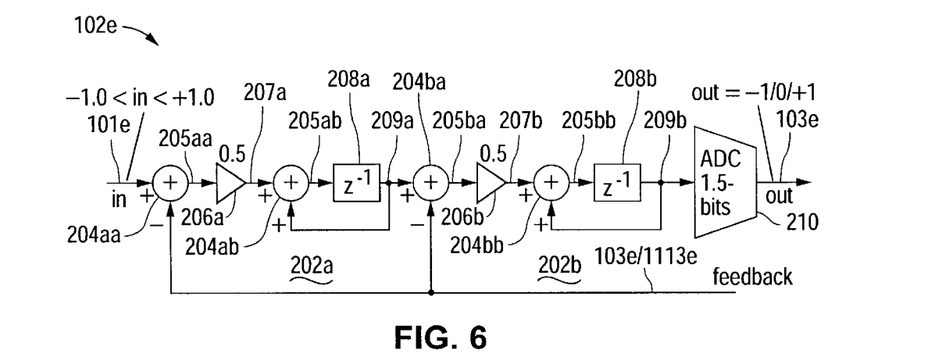
FIG. 6 is a schematic diagram of an example delta-sigma modulator circuit suitable for use in the circuit of FIG. 5.

Referring to FIG. 6, the delta-sigma modulator circuitry 102 of the circuit of FIG. 5 can be implemented according to virtually any of the well known conventional delta-sigma modulation techniques. One example delta-sigma modulator 102e would be that as depicted here in FIG. 6. In accordance with well known principles, such a modulator 102e, as a second order modulator, includes two similar cascaded stages 202a, 202b followed by an analog-to-digital converter 210 (ADC). The input signal 101e (which for the input delta-sigma modulator 102d would be a digital signal and for the correction delta-sigma modulator 102a would be an analog, e.g., zero, signal) is differentially summed with (i.e., summed with the inverse of) the feedback signal 103e (e.g., for the input delta-sigma modulator 102d), 113e (e.g., for the correction delta-sigma modulator 102a). The resulting signal 205aa is buffered by a buffer amplifier 206a with a gain equal to 0.5. The buffered signal 207a is summed with another feedback signal 209a produced by a latch 208a that latches such resultant sum signal 205ab.

In turn, the output signal 209a from this stage 202a is processed similarly in the subsequent stage 202b. The output signal 209b from this stage 202b is then converted by a 1.5 bit ADC 210 to produce the three-level output signal 103e.

Figure 7:
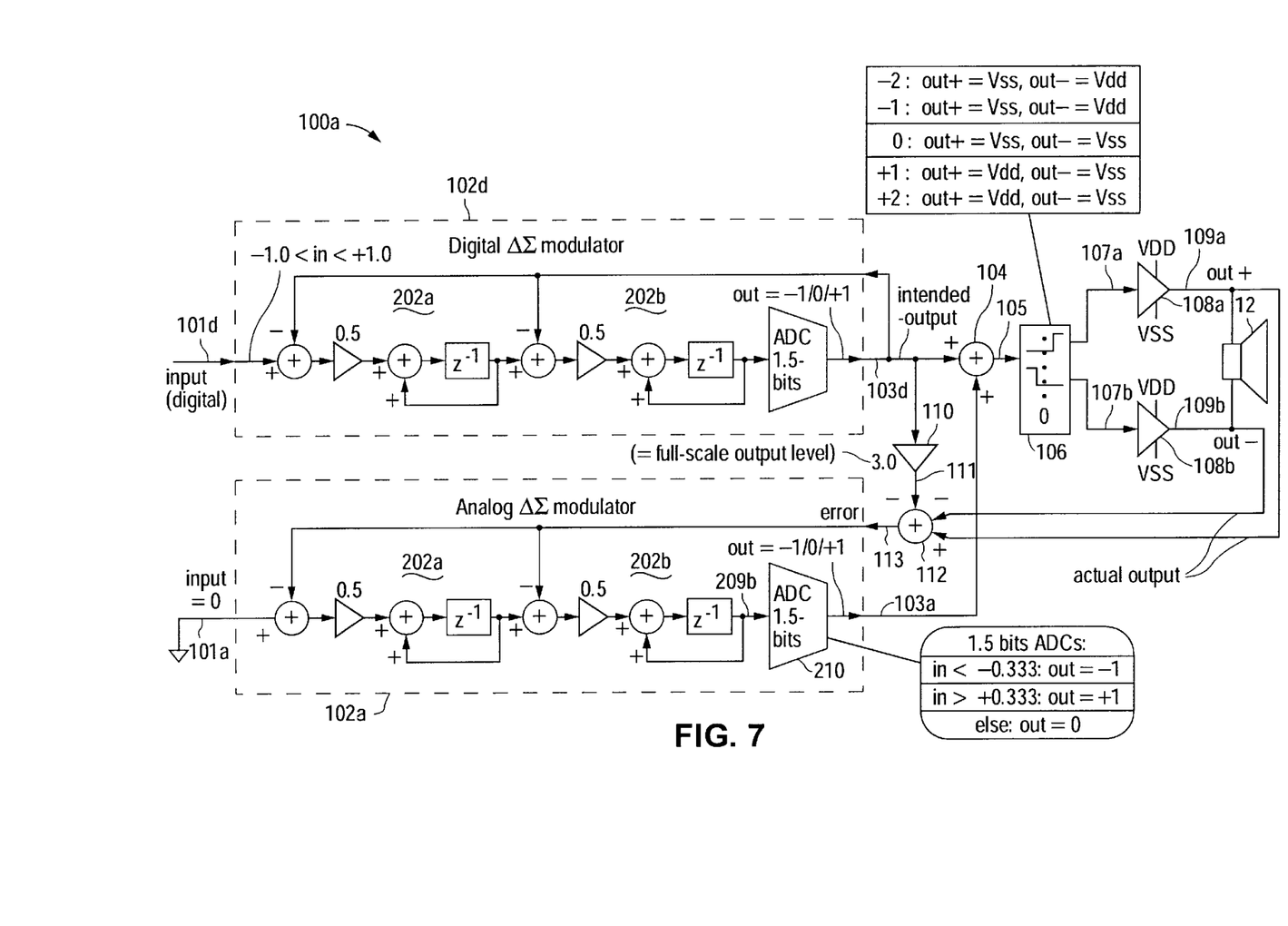
FIG. 7 is a schematic diagram of the circuit of FIG. 5 implemented using the delta-sigma modulator circuitry of FIG. 6.

Referring to FIG. 7 an implementation of the circuit of FIG. 5 using the second order modulator circuitry of FIG. 6 can be implemented as shown. In conformance with the foregoing discussion, the input digital signal 101d is processed by the two stages 202a, 202b of the input delta-sigma modulator 102d. Similarly, the analog reference signal 101a is processed by the correction delta-sigma modulator 102a. The output 103a from the correction delta-sigma modulator 102a, i.e., the output of the ADC 210, is a three-level output having a value of −1 when its input signal 209b is less then −0.333, a value of +1 when the input signal 209b is greater than +0.333, and a value of zero otherwise. These signals 103d, 103a are then processed as discussed above in connection with FIG. 5.

Figure 8A:
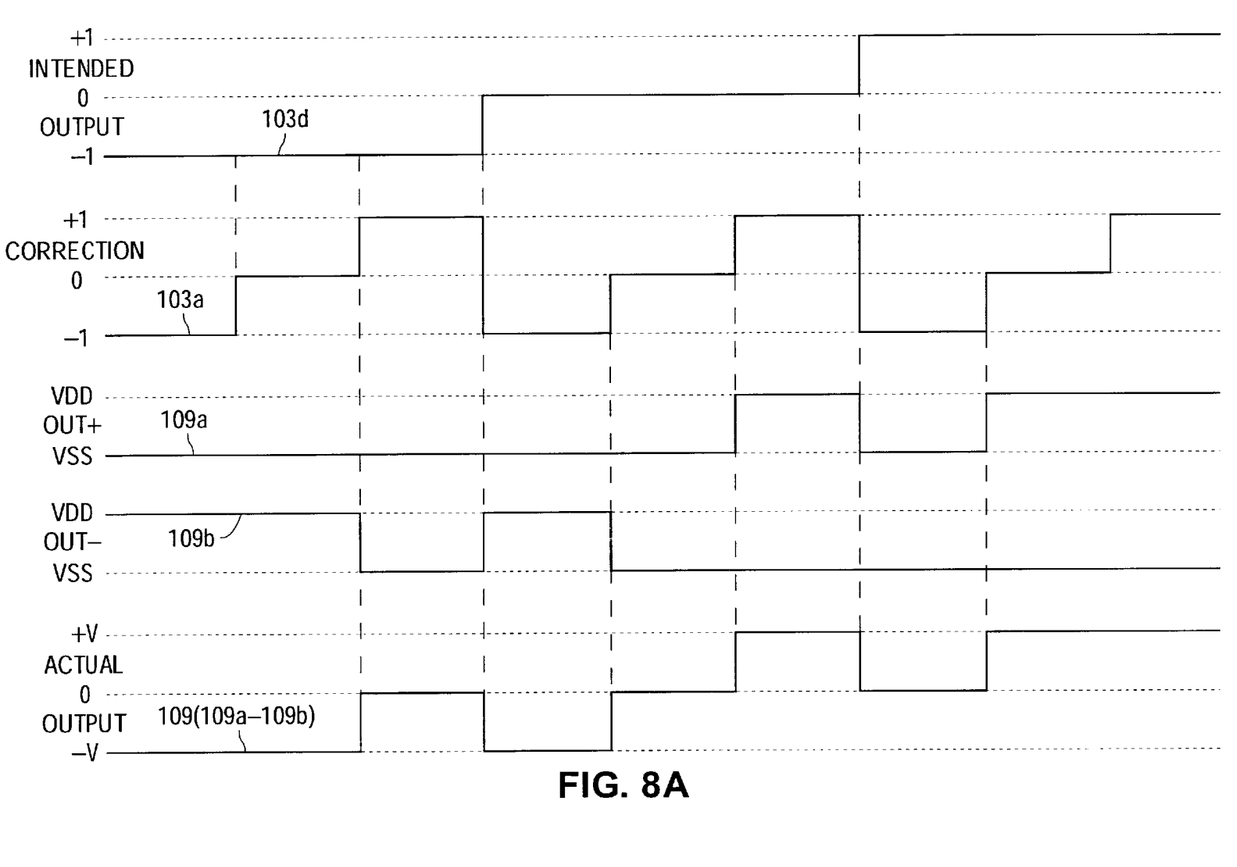
FIGS. 8A and 8B are signal timing diagrams for the circuit of FIG. 7.

Referring to FIG. 8A, the relationship among the delta-sigma modulator signals 103d, 103a, the sliced signals 109a, 109b and the actual (i.e., differential) output signal 109 can be better visualized. As shown, the sliced output signals 109a, 109b are binary digital signals that correspond to the nine different combinations of possible input signal states of the three-level delta-sigma modulator signals 103d, 103a. In turn, the actual output signal 109, provided as a differential signal to the load 12, is a digital signal having three signal states between the maximum +V and minimum −V voltages as determined by the power supply voltage potentials VDD, VSS.

Figure 8B:
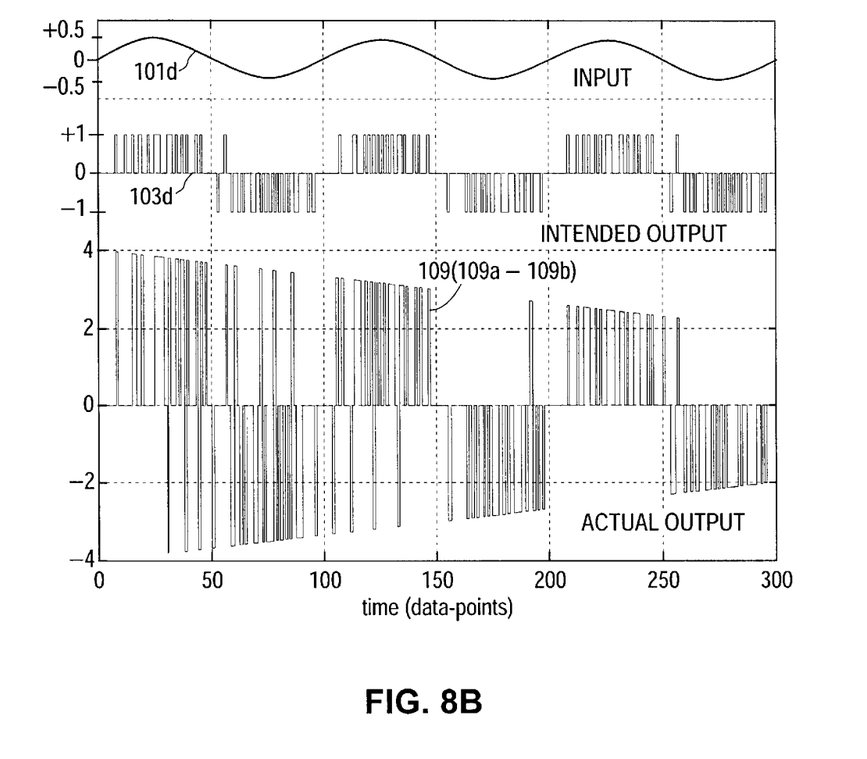

Referring to FIG. 8B, the circuitry of FIG. 7 was simulated in which the input signal 101d was a digital signal corresponding to a sine wave having an amplitude of +/−0.5 units (e.g., volts). The supply voltage VDD, VSS for the output buffer amplifiers 108a, 108b was varied from 4.0 volts down to 2.0 volts. The intended signal 103d has discrete signal states of −1, 0 and +1 units. The buffer amplifier 110 responsible for buffering the intended output signal 103d was simulated to have a gain of 3.0 volt, thereby establishing the desired, or "intended", output signal 109 across the load 12 to be in a range of +/−3.0 volts. As seen in FIG. 8B, as the power supply voltage changes from 4.0 down to 2.0 volts, the actual output 109 varies in peak amplitude from 4.0 to 2.0 volts. At the midpoint, i.e., at time=150, when the power supply is at 3.0 volts the output 109 is equal to that which is intended, and is identical in appearance, in terms of pulses, to the intended output signal 103d. However, when the power supply has become too low in value, e.g., during time interval 250–300, compensation is introduced in the form of additional signal pulses within the output signal 109, thereby explaining the difference in appearance between the actual output signal 109 and intended output signal 103d. Conversely, when the power supply is too high in value, e.g., during time interval 0–50, compensation is introduced by adding a number of pulses, including pulses of inverse value, within the actual output signal 109 as compared to the intended output signal 103d. (The simulation for purposes of the signal timing diagrams of FIG. 8B was performed with a low oversampling ratio. This was done merely for illustration so as to make the distinct signal pulses more visible in the figure. As will be readily understood, in a real application, the oversampling ratio will be much higher).

Figure 9:
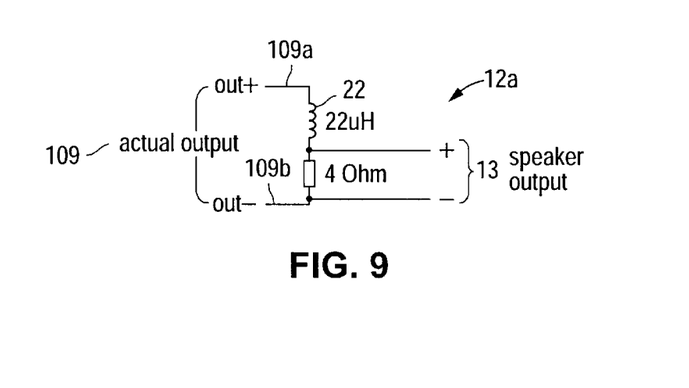
FIG. 9 is a schematic diagram of a load circuit in the form of an electronic circuit representing a loudspeaker for the circuit of FIG. 7.

Referring to FIG. 9, as noted above, in a real application, the oversampling ratio will be significantly higher (to avoid a need for a low pass filter at the output). Another simulation was performed using this circuit 12a as a model for the loudspeaker load 12. The input signal had a frequency of one kilohertz and the class-D amplifier circuitry 100a of FIG. 7 used a switching frequency of 10 megahertz.

Figure 10:
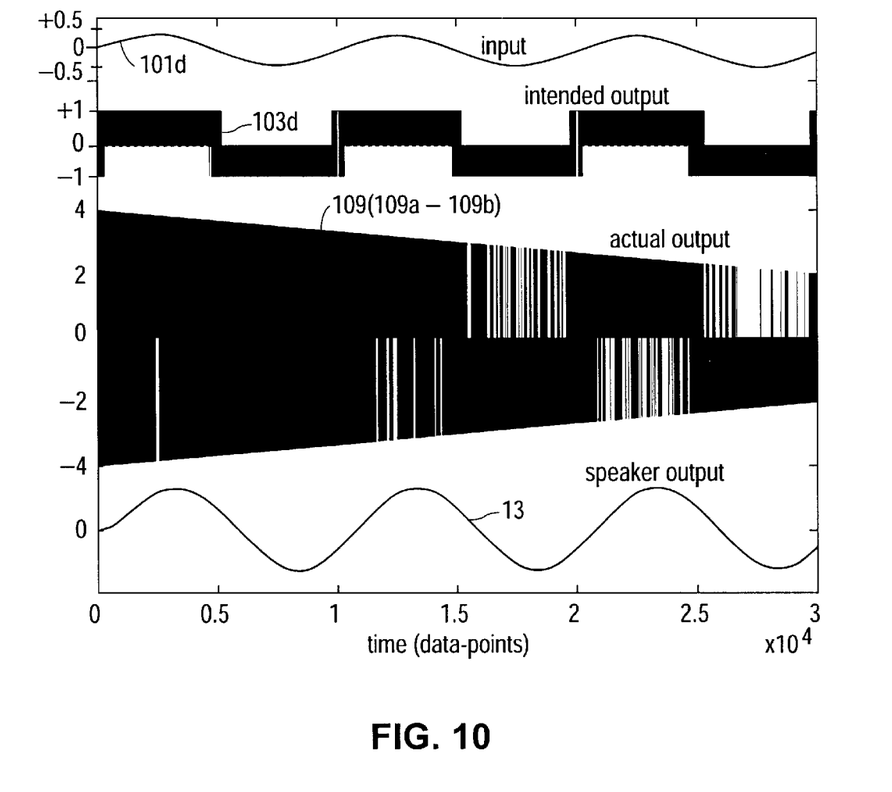
FIG. 10 is a signal timing diagram for the load circuit of FIG. 9 when driven by the circuit of FIG. 7.

Referring to FIG. 10, the simulation results appear as shown. As before, the input signal 101d was a digitized sine wave with an amplitude of +/−0.5 units and the intended output signal 103d had discreet signal states of −1, 0 and +1 units. The actual output signal 109 was applied across the load 12a modeled here as a series combination of a 22 microhenry inductor and a four ohm resistor. As before, the power supply was varied from 4.0 down to 2.0 volts, thereby producing a similar change in the peak amplitude of the actual output signal 109. However, as discussed above, the number of signal pulses within the actual output signal 109 was varied to compensate for the amplitude changes. This, in combination with the filtering provided by the inherent inductance of the loudspeaker 12a, produces a speaker output signal 13 appearing as a true representation of the original input signal 101d.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a class-D amplifier, comprising:
   delta-sigma modulation circuitry that
      receives and converts a digital input signal to a first multivalue digital signal corresponding to said digital input signal, and
      receives a feedback signal and in response thereto receives and converts an analog input signal to a second multivalue digital signal corresponding to said feedback signal;
   first signal combining circuitry, coupled to said delta-sigma modulation circuitry, that receives and combines said first and second multivalue digital signals and in response thereto provides a third multivalue digital signal corresponding to a sum of said first and second multivalue digital signals;
   signal conversion circuitry, coupled to said first signal combining circuitry, that receives and converts said third multivalue digital signal to first and second binary digital signals with first and second binary signal values that vary in relation to said third multivalue digital signal; and
   second signal combining circuitry, coupled to said delta-sigma modulation circuitry and said signal conversion circuitry, that receives and combines said first multivalue digital signal and said first and second binary digital signals and in response thereto provides said feedback signal.

2. The apparatus of claim 1, wherein said delta-sigma modulation circuitry comprises:
   a first delta-sigma modulation circuit that receives and converts said digital input signal to said first multivalue digital signal; and
   a second delta-sigma modulation circuit that receives said feedback signal and in response thereto receives and converts said analog input signal to said second multivalue digital signal.

3. The apparatus of claim 2, wherein said first delta-sigma modulation circuit comprises a digital delta-sigma modulation circuit.

4. The apparatus of claim 2, wherein said second delta-sigma modulation circuit comprises an analog delta-sigma modulation circuit.

5. The apparatus of claim 1, wherein said signal conversion circuitry comprises multivalue signal comparison circuitry that receives and compares said third multivalue digital signal with a plurality of reference signal values and in response thereto provides said first and second binary digital signals.

6. The apparatus of claim 1, wherein:
   each one of said first and second multivalue digital signals includes three digital signal values; and
   said third multivalue digital signal includes five digital signal values.

7. The apparatus of claim 1, wherein said feedback signal corresponds to a difference between said first and second binary digital signals and said first multivalue digital signal.

8. An apparatus including a class-D amplifier, comprising:
   modulator means for
      receiving and converting a digital input signal to a first multivalue digital signal corresponding to said digital input signal, and
      receiving a feedback signal and in response thereto receiving and converting an analog input signal to a second multivalue digital signal corresponding to said feedback signal;
   first combiner means for combining said first and second multivalue digital signals and providing a third multivalue digital signal corresponding to a sum of said first and second multivalue digital signals;
   converter means for converting said third multivalue digital signal to first and second binary digital signals with first and second binary signal values that vary in relation to said third multivalue digital signal; and
   second combiner means for combining said first multivalue digital signal and said first and second binary digital signals and providing said feedback signal.

9. The apparatus of claim 8, wherein said modulator means comprises:
   first delta-sigma modulator means for converting said digital input signal to said first multivalue digital signal; and
   second delta-sigma modulator means for receiving said feedback signal and in response thereto converting said analog input signal to said second multivalue digital signal.

10. The apparatus of claim 9, wherein said first delta-sigma modulator means comprises digital delta-sigma modulator means.

11. The apparatus of claim 9, wherein said second delta-sigma modulator means comprises analog delta-sigma modulator means.

12. The apparatus of claim 8, wherein said converter means comprises signal comparator means for comparing said third multivalue digital signal with a plurality of reference signal values and providing said first and second binary digital signals.

13. The apparatus of claim 8, wherein:
   each one of said first and second multivalue digital signals includes three digital signal values; and
   said third multivalue digital signal includes five digital signal values.

14. The apparatus of claim 8, wherein said feedback signal corresponds to a difference between said first and second binary digital signals and said first multivalue digital signal.

15. A method for class-D signal amplification comprising:

performing delta-sigma modulation of a digital input signal to generate a first multivalue digital signal corresponding to said digital input signal;

receiving a feedback signal and in response thereto performing delta-sigma modulation of an analog input signal to generate a second multivalue digital signal corresponding to said feedback signal;

combining said first and second multivalue digital signals to generate a third multivalue digital signal corresponding to a sum of said first and second multivalue digital signals;

converting said third multivalue digital signal to first and second binary digital signals with first and second binary signal values that vary in relation to said third multivalue digital signal; and combining said first multivalue digital signal and said first and second binary digital signals to generate said feedback signal.

16. The apparatus of claim 15, wherein said performing delta-sigma modulation of a digital input signal to generate a first multivalue digital signal corresponding to said digital input signal comprises performing digital delta-sigma modulation.

17. The apparatus of claim 15, wherein said receiving a feedback signal and in response thereto performing delta-sigma modulation of an analog input signal to generate a second multivalue digital signal corresponding to said feedback signal comprises performing analog delta-sigma modulation.

18. The apparatus of claim 15, wherein said converting said third multivalue digital signal to first and second binary digital signals with first and second binary signal values that vary in relation to said third multivalue digital signal comprises comparing said third multivalue digital signal with a plurality of reference signal values to generate said first and second binary digital signals.

19. The apparatus of claim 15, wherein:

said performing delta-sigma modulation of a digital input signal to generate a first multivalue digital signal corresponding to said digital input signal comprises generating said first multivalue digital signal to include three digital signal values;

said receiving a feedback signal and in response thereto performing delta-sigma modulation of an analog input signal to generate a second multivalue digital signal corresponding to said analog input signal comprises generating said second multivalue digital signal to include three digital signal values; and said combining said first and second multivalue digital signals to generate a third multivalue digital signal corresponding to a sum of said first and second multivalue digital signals comprises generating said third multivalue digital signal to include five digital signal values.

20. The apparatus of claim 15, wherein said combining said first multivalue digital signal and said first and second binary digital signals to generate said feedback signal comprises subtracting said second binary digital signal and said first multivalue digital signal from said first binary digital signal.

* * * * *